(12) United States Patent
Dine

(10) Patent No.: US 7,994,724 B2
(45) Date of Patent: Aug. 9, 2011

(54) INDUCTIVE PLASMA APPLICATOR

(75) Inventor: Sébastien Dine, Chartres (FR)

(73) Assignees: Ecole Polytechnique, Palaiseau (FR); Centre National de la Recherche Scientifique-CNRS, Paris (FR)

( * ) Notice: Subject to any disclaimer, the term of this patent is extended or adjusted under 35 U.S.C. 154(b) by 326 days.

(21) Appl. No.: 12/412,553

(22) Filed: Mar. 27, 2009

(65) Prior Publication Data
US 2010/0244699 A1 Sep. 30, 2010

(51) Int. Cl.
*H01J 7/24* (2006.01)
(52) U.S. Cl. ......... 315/111.21; 315/111.41; 315/111.51; 156/345
(58) Field of Classification Search .............. 315/111.01–111.91; 118/723 E, 118/723 I; 156/345
See application file for complete search history.

(56) References Cited

U.S. PATENT DOCUMENTS

| | | | |
|---|---|---|---|
| 4,745,337 A * | 5/1988 | Pichot et al. ............. | 315/111.41 |
| 5,304,279 A * | 4/1994 | Coultas et al. ........... | 156/345.49 |
| 5,435,881 A | 7/1995 | Ogle | |
| 5,683,548 A | 11/1997 | Hartig et al. | |
| 5,795,429 A | 8/1998 | Ishii et al. | |
| 5,944,942 A | 8/1999 | Ogle | |
| 6,020,686 A | 2/2000 | Ye et al. | |
| 6,068,784 A | 5/2000 | Collins et al. | |
| 6,080,271 A | 6/2000 | Fujii | |
| 6,158,384 A | 12/2000 | Ye et al. | |
| 6,204,607 B1 | 3/2001 | Elingboe | |
| 6,252,354 B1 * | 6/2001 | Collins et al. ............ | 315/111.51 |
| 6,273,022 B1 | 8/2001 | Pu et al. | |
| 6,321,681 B1 | 11/2001 | Colpo et al. | |
| 6,348,126 B1 | 2/2002 | Hanawa et al. | |
| 6,388,382 B1 | 5/2002 | Doi et al. | |
| 6,422,173 B1 | 7/2002 | Nakajima | |
| 6,551,447 B1 * | 4/2003 | Savas et al. ............. | 156/345.48 |
| 6,755,150 B2 | 6/2004 | Lai et al. | |
| 6,850,012 B2 * | 2/2005 | Edamura et al. ......... | 315/111.51 |
| 7,255,774 B2 | 8/2007 | Vukovic et al. | |
| 2008/0050292 A1 | 2/2008 | Godyak | |
| 2008/0050537 A1 | 2/2008 | Godyak | |
| 2008/0088242 A1 | 4/2008 | Shun'ko | |
| 2008/0124254 A1 | 5/2008 | Choi | |

FOREIGN PATENT DOCUMENTS
WO   WO 2006/056573   6/2006

* cited by examiner

*Primary Examiner* — Douglas W Owens
*Assistant Examiner* — Tung X Le
(74) *Attorney, Agent, or Firm* — Miller, Matthias & Hull LLP

(57) ABSTRACT

An inductive plasma applicator comprises a ferromagnetic inductively coupled source and an electrode with a hole pattern centered with respect to the plasma source. Such plasma applicator provides an efficient energy transfer to the plasma. The plasma applicator is preferably manufactured using a technology for producing electrical circuits. The electrode and a coil of the ferromagnetic inductively coupled plasma source are metal track portions formed on an insulating substrate. For example, the plasma applicator is manufactured using printed circuit board technology.

27 Claims, 13 Drawing Sheets

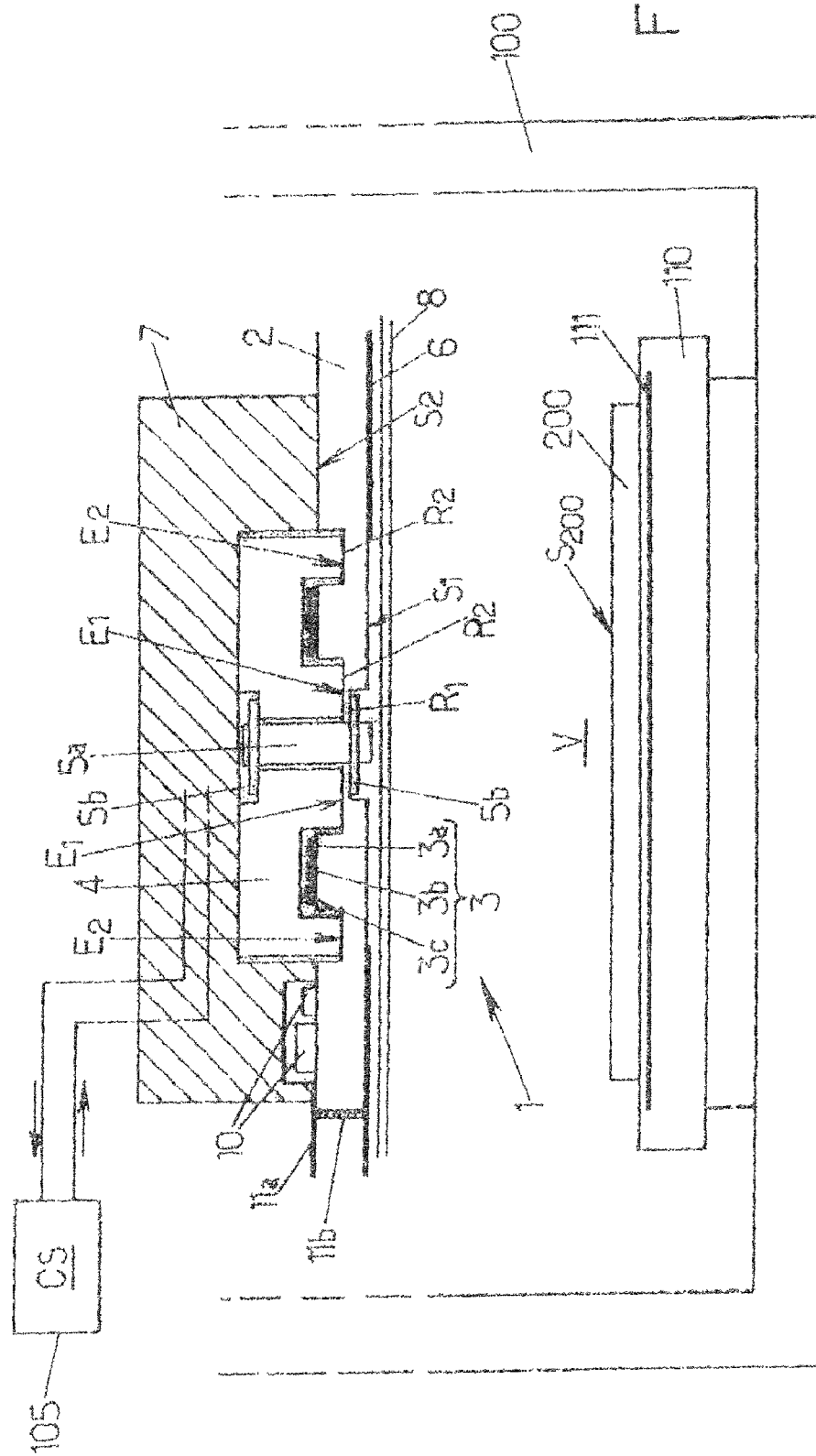

INDUCTIVE PLASMA APPLICATOR

BACKGROUND OF THE INVENTION

The present invention relates to an inductive plasma applicator, a vacuum vessel comprising this inductive plasma applicator, and a surface treatment device comprising the vacuum vessel.

Plasma treatments are widely used in the industry for many purposes, such as surface activation, in particular for polymer-based materials, material thin film deposition, layer etching, etc. Many applications also require that the plasma treatments are performed on large area substrates, ranging from about one square-centimeter to several square meters. For example, architectural glazings implement thin film stacks that are deposited on glass panels of about 20 square-meters. Thin film stacks are also deposited on continuous polymer-based sheets in roll-coaters.

According to a well-known implementation mode of plasma treatments, the plasma is energized with a RF frequency magnetic field. The magnetic field is produced in a plasma volume using a coil which is supplied with an AC current. The AC magnetic field produces in turn an electric field which transfers energy to the plasma.

Actually, a processing time for such plasma treatment depends on physical parameters of the plasma which is implemented. For example, the magnetic field in the plasma volume is an important parameter, as well as the separating distance between the surface to be treated and the location where the plasma density is the highest. So, a plasma treatment device should be designed taking into account values for such parameters which are optimized for the treatment and the application of concern. Therefore, there is a need for supplying plasma treatment devices with design and geometry parameters which can be varied easily on order.

Another need relates to large area plasma sources, which are suitable for performing uniform treatments of wide substrates. In particular, such large area plasma sources should be suitable for implementation in vacuum devices with fixed or moving substrates.

A further need is to provide plasma generating devices which are suitable for being installed easily in many vacuum vessels, with short installation time.

A further need is also to provide plasma generating devices with unit cost which is reduced with respect to the plasma sources currently available.

Therefore, an object of the present invention is to provide a plasma source which meets at least one of these requirements.

SUMMARY OF THE INVENTION

To this end, the present invention provides an inductive plasma applicator which comprises:
- a support member with a generally flat plate shape, adapted for forming part of or being arranged on a vacuum vessel wall, this support member having a front surface which is intended to be oriented towards an inner volume of the vacuum vessel, a back surface and possibly additional surfaces intermediate between the front and back surfaces, said surfaces being parallel to each other;
- at least one ferromagnetic inductively coupled plasma source, which includes:
  - at least one electrically conducting coil comprising one turn or several turns with a planar spiral design arranged on a surface of the support member;
  - an open-loop ferromagnetic core having at least two end faces oriented towards one and same magnetic output side; and
  - means for rigidly connecting the ferromagnetic core onto the support member opposite to the front surface thereof, with the magnetic output side of the ferromagnetic core oriented towards the inner volume of the vacuum vessel, and the coil turn or turns surrounding a magnetic flux bundle exiting through at least one of the end faces of the ferromagnetic core; and
- at least one electrode having a hole pattern centred with respect to the coil and adapted not to inhibit the magnetic flux bundle from extending in the inner volume of the vacuum vessel, this electrode being further adapted for forming a capacitor with another electrode external to the applicator.

In addition, the coil of the ferromagnetic inductively coupled plasma source and the electrode comprise respective metal track portions which are distributed on the surfaces of the support member, with the metal track portions of the electrode being located closer to the inner volume of the vacuum vessel than the metal track portions of the coil.

Due to the generally flat plate shape of the support member, the inductive plasma applicator of the invention can be incorporated easily into a wall of a vacuum vessel used for the plasma treatment. It can be arranged alternatively parallel to the vessel wall, on its inner or outer side.

This shape for the support member of the inductive plasma applicator is also compatible with a modular design, suitable for arranging several inductive plasma applicators close to one another, and thus forming a large area plasma source.

In addition, the combination of the coil and the electrode together with the ferromagnetic core makes it possible to produce the plasma with location and physical parameters that are well-controlled and adapted to the surface treatment intended. In particular, this combination provides an efficient coupling between plasma-generating species introduced into the vacuum vessel and an energy power supply which is used for energizing the plasma.

In preferred embodiments of the invention, the support member may comprise an assembly of several substrate units stacked on one another, with surfaces of each substrate unit forming the surfaces of the support member. Then, the inductive plasma applicator can be designed easily with two or more electrically conducting portions that are located with varying shifts perpendicular to the front surface of the applicator, in particular for forming the coil and the electrode. The coil may also comprise two or more sets of turns, each turn set being arranged with a planar spiral design on a different surface of the support member.

Advantageously, the support member and the metal track portions may form a printed circuit board assembly, a thick film technology assembly, or a co-fired ceramic technology assembly.

The invention also provides a vacuum vessel which comprises such inductive plasma applicator.

It also provides a surface treatment device which comprises such vacuum vessel.

These and other features and advantages of the invention will become apparent from the detailed specification below, which is provided only for illustration purpose without inducing any limitation, based on the appended drawings now listed.

BRIEF DESCRIPTION OF THE DRAWINGS

FIGS. 2a and 2b are cross-sectional views of two inductive plasma applicators according to the invention;

DETAILED DESCRIPTION OF PREFERRED EMBODIMENTS OF THE INVENTION

Figure 1A:
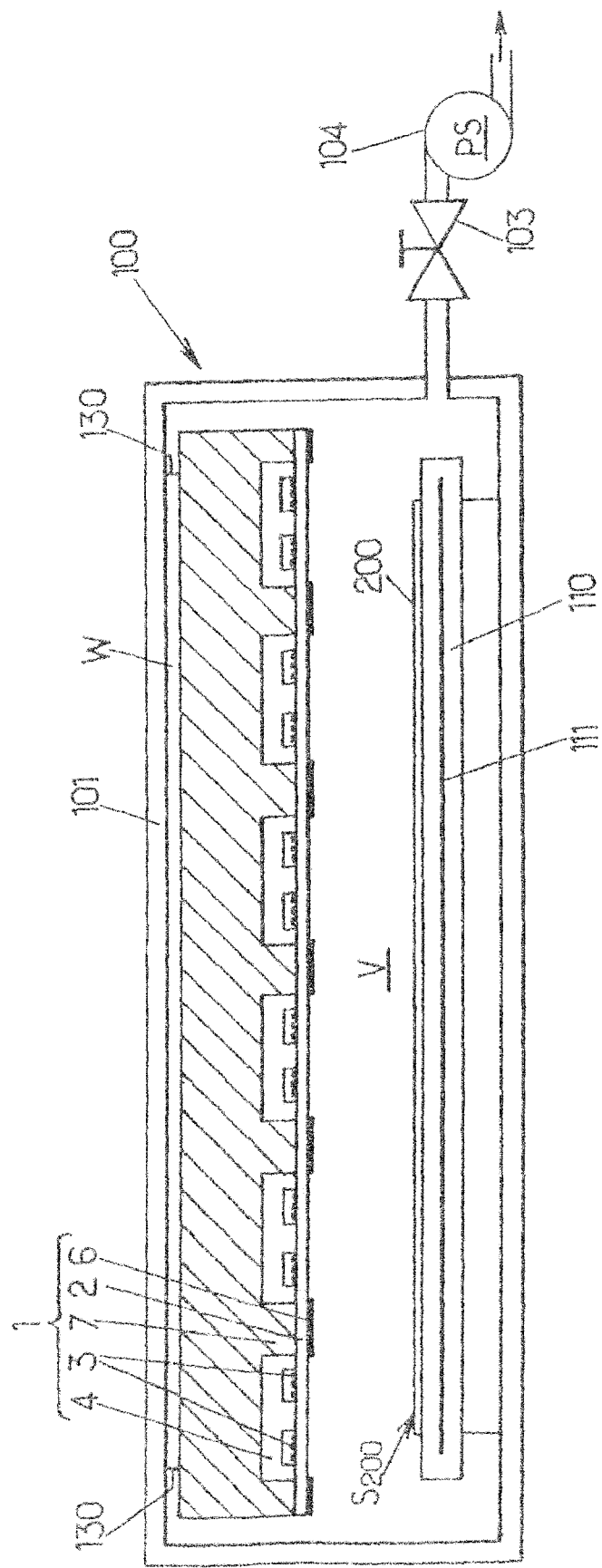
FIGS. 1a-1d are cross-sectional views of surface treatment devices provided with inductive plasma applicators according to the invention.

In the Figures, reference numbers 1 and 100 denote respectively the inductive plasma applicator and the vacuum vessel provided this plasma applicator. The vacuum vessel 100 is pumped using a pumping system 104, noted PS, which may connected to the vacuum vessel with a vacuum valve 103.

Elements of the vacuum vessel which are well known in the art are not represented and described again. Such known elements may include vacuum probes, heating elements, temperature probes, etc. Reference numbers 110, 111 and 200 denote respectively a substrate holder, an electrode which is included in the substrate holder and the substrate to be plasma-processed. V denotes a center part of the inner volume of the vessel 100, where the plasma is to be formed. The plasma volume V is located between an exposed surface $S_{200}$ of the substrate 200 and the plasma applicator 1. Depending on the application considered, the substrate 200 may be an electronic circuit wafer, a polymer-based film, a glass panel, etc.

Although the FIGS. 1a-1d, 2a and 2b show a vacuum vessel in which the substrate to be plasma-treated is fixed, the vacuum vessel may be adapted alternatively for treating moving substrates. Such moving substrates may be rigid panels which are translated by carrier rolls, from an entrance area outside the vacuum vessel to an exit area also external to the vacuum vessel. Then the substrates are successively loaded and unloaded into the vacuum vessel through appropriate entrance and exit airlocks. The moving substrate may also be a resilient film which is unrolled from a feed roller, then plasma-treated when being continuously exposed to the plasma or to species produced by the plasma, and then wound again on a discharge roller. So the vacuum vessel may also be of roll-coater type, adapted for the feed roller and the discharge roller to be contained within the vessel. All these configurations of the vacuum vessel are well-known in the art, and the inductive plasma applicator of the invention may be implemented whatever the actual vacuum vessel configuration may be.

Furthermore, the inductive plasma applicator may be sized in accordance with the dimensions of the substrates to be plasma-treated. To this purpose, the applicator dimensions may be adapted on the order, in particular the dimensions of the coil, the ferromagnetic core and the electrode. In addition, it will be described later in this specification how several inductive plasma applicators may be combined together for obtaining a plasma device suitable for processing large area substrates.

It should also be understood that the invention is directed to the means for producing plasma, and may be implemented whatever the plasma treatment of the substrate may be. For example, the plasma treatment may be a surface cleaning of the substrate, a surface activation of the substrate, a plasma-activated chemical processing of the substrate, a layer deposition onto the substrate surface, an etching of a layer initially borne by the substrate, etc.

The inductive plasma applicator 1 is built starting from a support member 2. This support member 2 has a generally flat plate shape, with a front surface $S_1$ and a back surface $S_2$. The surfaces $S_1$ and $S_2$ are parallel and the plasma applicator is arranged with the vessel 100 so that the surface $S_1$ is facing the plasma volume V.

Because of the generally flat plate shape of the plasma applicator 1, the applicator may form part of one of the walls of the vacuum vessel 100. FIGS. 1a-1d illustrate four alternative modes for such combination of the plasma applicator with a vacuum vessel wall.

According to FIG. 1a, the plasma applicator 1 is arranged in the inner volume of the vacuum vessel 100, close to and parallel to one of the walls, for example the horizontal upper wall 101. The plasma applicator 1 is secured to this wall with appropriate means 130, such as tie rods. With such mounting mode, the whole plasma applicator 1 is submitted to the vacuum conditions, in particular the reduced pressure. In addition, a rear gap W with reduced pressure is present between the plasma applicator 1 and the upper vessel wall 101. For such mounting configuration, it may be advantageous that a maximum thickness of the plasma applicator between a back surface of each ferromagnetic core opposite to the front surface $S_1$ and this surface $S_1$ is less than 6 cm (centimetre).

Figure 1B:
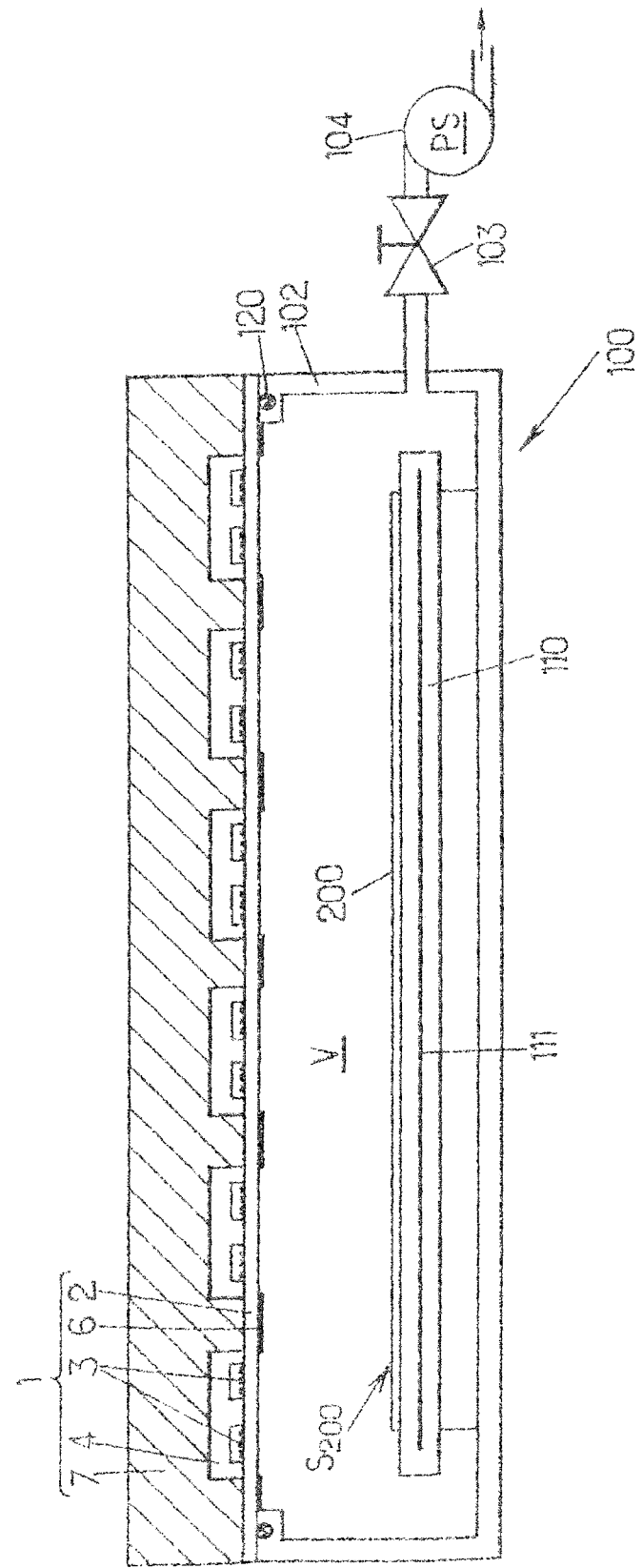

Alternatively, the plasma applicator 1 may form itself the upper vessel wall (FIG. 1b). In this case, the support member 2 of the plasma applicator 1 is pressed against a top flange of the sidewalls 102 of the vacuum vessel 100, with a sealing joint 120 between. Then, the components of the plasma applicator which are located opposite to the plasma volume V with respect to the support member 2 may be submitted to the ambient pressure, i.e. the pressure existing outside the vacuum vessel 100.

Figure 1C:
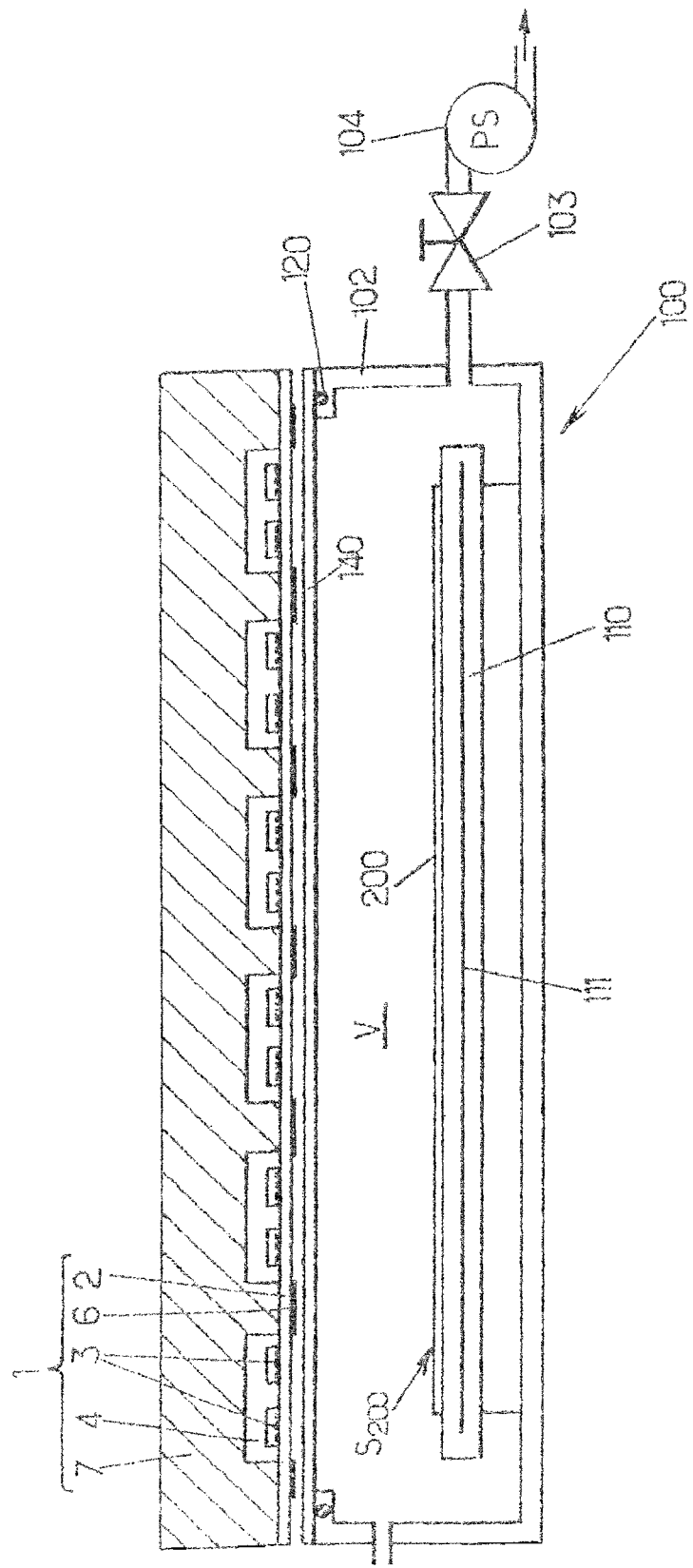

According to another possible configuration illustrated by FIG. 1c, the vacuum vessel 100 is closed on one side by a window 140, and the plasma applicator 1 is arranged opposite to the plasma volume V with respect to the window 140. Then, the whole plasma applicator 1, including the support member 2, is submitted to the pressure existing outside the vacuum vessel 100.

Figure 1D:
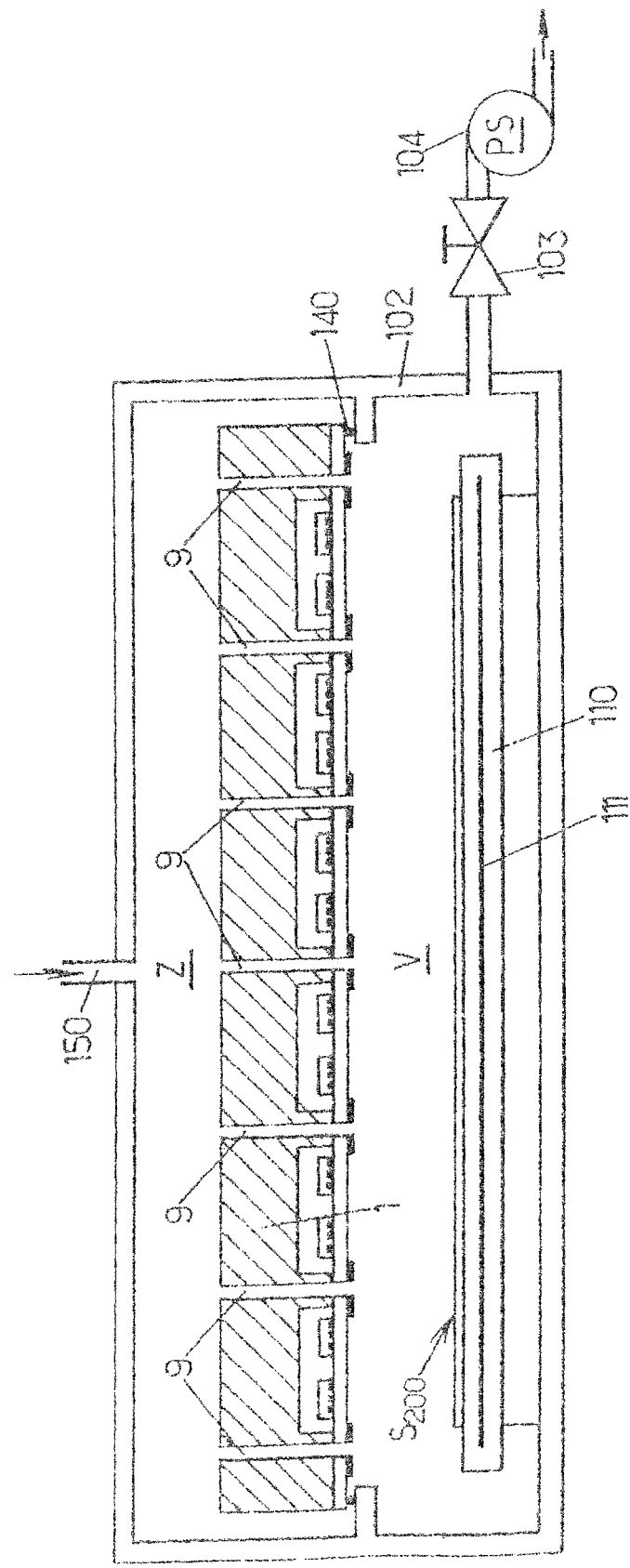

FIG. 1d illustrates still another configuration, where the plasma applicator 1 forms a separating wall within the vacuum vessel 100, between the plasma volume V and a rear volume Z. The peripheral connection of the plasma applicator 1 to the sidewall 102 of the vessel 100 is provided with a sealing joint 140, so as to be gastight. The advantage provided by such mounting configuration will be described later.

The configurations illustrated by FIGS. 1a-1d explain the meaning of the phrase reciting that the support member 2 forms part of a vacuum vessel wall.

The surfaces $S_1$ and $S_2$ of the support member 2 may each be designed with recesses $R_1$ and $R_2$ (FIGS. 2a-2b), as explained later in this specification. Such recesses are comprised in the description of the support member 2 when specifying that this latter has a generally flat plate shape.

The plasma applicator 1 comprises both a ferromagnetic inductively coupled plasma (F-ICP) source and an electrode for transferring energy to the plasma in the plasma volume V. Thanks to such combination of means for transferring energy to the plasma, the energy transfer can be efficient and the plasma can be located appropriately with respect to the exposed surface $S_{200}$ of the substrate 200.

The ferromagnetic inductively coupled plasma source itself includes a coil 3, a ferromagnetic core 4 and means for securing the core 4 onto the support member 2. The coil 3 is comprised of at least one metal track portion arranged on a surface of the support member 2 which is parallel to the surfaces $S_1$ and $S_2$. For illustrative purpose, the metal track portion of the coil 3 is arranged on the back surface $S_2$ in FIGS. 1a-1d and 2a-2b, but one or several tracks may also be arranged on at least one internal surface of the support member 2, intermediate between the surfaces $S_1$ and $S_2$ as described later. The metal track portion of the coil 3 is arranged so as to form continuous turns 3a-3c with a spiral design, without any limit on the turn number. To this purpose, the metal track portion may comprise a continuous curved segment or a series of connected rectilinear segments, depending on the design technology used. The coil 3 is designed so as to produce a magnetic field when supplied with an electrical current between end terminals of this coil. Then, the magnetic field produced extends into the plasma volume V with a flux bundle substantially perpendicular to the front surface $S_1$ of the support member 2. The metal track portion of the coil 3 is advantageously more than 30 μm (micrometer) thick perpendicular to the surfaces of the support member 2, preferably more than 100 μm thick, so that it can be supplied with sufficient current.

According to the invention, the ferromagnetic core 4 is coupled with the coil 3. The core 4 is made of a ferromagnetic material and has an open-loop design, so that it increases the strength of the magnetic field produced by the coil 3 when arranged so that the flux bundle goes through an end face of the core. A ferrite material can be used for the core 4, for example Mn—Zn or Ni—Zn ferrites. Such ferrite core 4 is commercially available and widely used in transformers, for example. In transformers, two such open-loop ferrite cores are paired with mating respective end faces. Then, they form together a closed loop of ferromagnetic material, suitable for electrical voltage transforming. In the present invention, the ferromagnetic core 4 forms an incomplete loop, so-called open-loop, so that it has at least two end faces $E_1$ and $E_2$ oriented towards one and same magnetic output side. Then, the coil turns 3a-3c surround at least one of the end faces $E_1$ and $E_2$, so that the strengthened magnetic flux bundle is concentrated within the ferromagnetic core 4 and output at the end faces $E_1$ and $E_2$. Outside the ferromagnetic core 4, the strengthened magnetic flux-bundle extends in the gap free of ferromagnetic material between and beyond the end faces $E_1$ and $E_2$, i.e. in the plasma volume V. If a ferrite core is used, many designs are available commercially for the ferrite core 4, such as Pot-Core®, E-Core®, X-core®, Slab Pot-Core®, PQ-Core®, RM-Core®, Planar Core®, etc., and the Man skilled in the art will be able to select one of these designs for implementing the combination with the coil 3 that has just been described. In the Figures, the ferromagnetic core 4 has a center end face $E_1$, and a peripheral end face $E_2$ which surrounds the end face $E_1$, with a gap between. The coil 3 is located in this gap around the end face $E_1$. In particular, it may be advantageous that a ratio between a thickness and a longest diameter of the ferromagnetic core 4 is higher than 0.2, preferably higher that 0.3, with said thickness and diameter being measured respectively perpendicular and parallel to the surfaces of the support member 2. Indeed such ratio values provide higher magnetic field strength in the plasma volume V.

For the same purposes of increasing the magnetic field strength in the plasma volume V and positioning it with respect to the substrate 200, the end faces $E_1$ and $E_2$ of the ferromagnetic core 4 may be inserted into the recesses $R_2$ of the back surface $S_2$ of the support member 2. In this way, the end faces $E_1$ and $E_2$ of the ferromagnetic core 4 can be closer to the inner volume of the vacuum vessel 100 than the metal track portions of the coil 3.

The ferromagnetic core 4 is secured onto the support member 2 with the appropriate means. For example, the ferromagnetic core 4 is provided with a through-hole and a shaft 5a is arranged within this hole with blocking elements 5b which push the ferromagnetic core 4 against the support member 2. One of the blocking elements 5b located on the front surface $S_1$ may be contained in the recess $R_1$.

The coil 3 combined with the ferromagnetic core 4 forms a so-called transformer coupled plasma (TCP) source.

The electrode is denoted by the reference number 6. It is comprised of another metal track portion or portions which is (are) also borne by the support member 2, parallel to the front surface $S_1$ and closer to the plasma volume V than the coil 3. For illustrative purpose, it is represented in the FIGS. 1a-1d and 2a-2b on the front surface $S_1$, but it may be borne alternatively by a surface of the support member 2 which is intermediate between the front surface $S_1$ and the coil supporting surface. The electrode 6 is intended to be polarized electrically with respect to the substrate holder electrode 111, or with any other electrode internal to the vessel 100, using a voltage source to be described later. In this way, the electrode 6 participates in supplying energy to the plasma, in addition to the ferromagnetic inductively coupled plasma source. Actually, both electrodes 6 and 111 form a capacitor suitable for producing an electric field therebetween, and thus energizing the plasma. For this reason, the plasma obtained is commonly called capacitively coupled plasma (CCP). Therefore, a plasma applicator according to the present invention is a combination of both a ferromagnetic inductively coupled plasma device and a capacitively coupled plasma device. Thus, its operation efficiency is higher that that of each capacitive or inductive device implemented alone. It is therefore possible to control independently the plasma density and the energy of ions in the plasma. The plasma density is mainly controlled by the amount of polarization applied to the coil 3, while the energy of the ions is mainly controlled by the amount of polarization which is applied to the electrode 6. These independent controls allow access to new plasma regimes beneficial to many plasma-based surface treatments.

The electrode 6 is provided with a hole pattern centered with respect to the coil 3. Such hole pattern may be designed so that variations in the electric field produced by the electrode 6 itself in front of the ferromagnetic inductively coupled plasma source, are smoothened parallel to this electrode. Preferably, it is also designed for preventing eddy currents from being generated azimuthally inside the electrode 6 due to the time-varying magnetic field generated by the coil. The hole pattern is similar to the ones used for Faraday shields, which have been implemented in inductively coupled plasmas to reduce the capacitive RF coupling between the coil and the plasma while preventing the induction of eddy currents. A Faraday shield, usually grounded, is placed between the RF antenna coil and the plasma volume in order to reduce the voltage of the plasma, also called plasma potential, due to the capacitive coupling. The decrease of the plasma potential leads to a decrease of the energy of the ions impinging onto the vessel walls, and thus reduces the wall erosion in the vessel.

Contrary to the Faraday shields in inductively coupled plasma sources, such hole pattern for the electrode 6 is not intended to suppress the parasitic capacitive coupling between the coil and the plasma, because the enhancement of the magnetic field strength provided by the ferromagnetic core allows a dramatic decrease of the voltage applied to the coil, reducing the parasitic coupling as a consequence. Such hole pattern is used to reduce a possible discontinuity in the electric field produced by the electrode 6 in front of the coil 3 while preventing eddy currents from being generated.

Figure 3A:
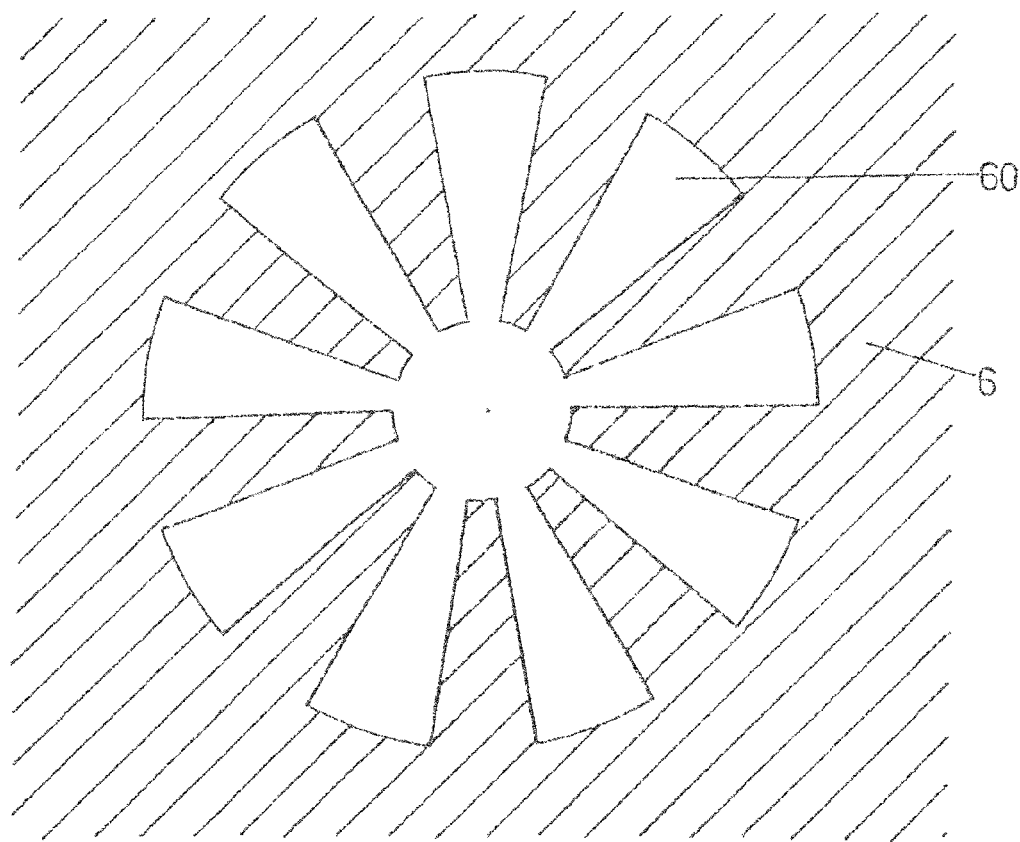
FIGS. 3a and 3b illustrate possible designs for an electrode of an inductive plasma device according to the invention.
Figure 3B:
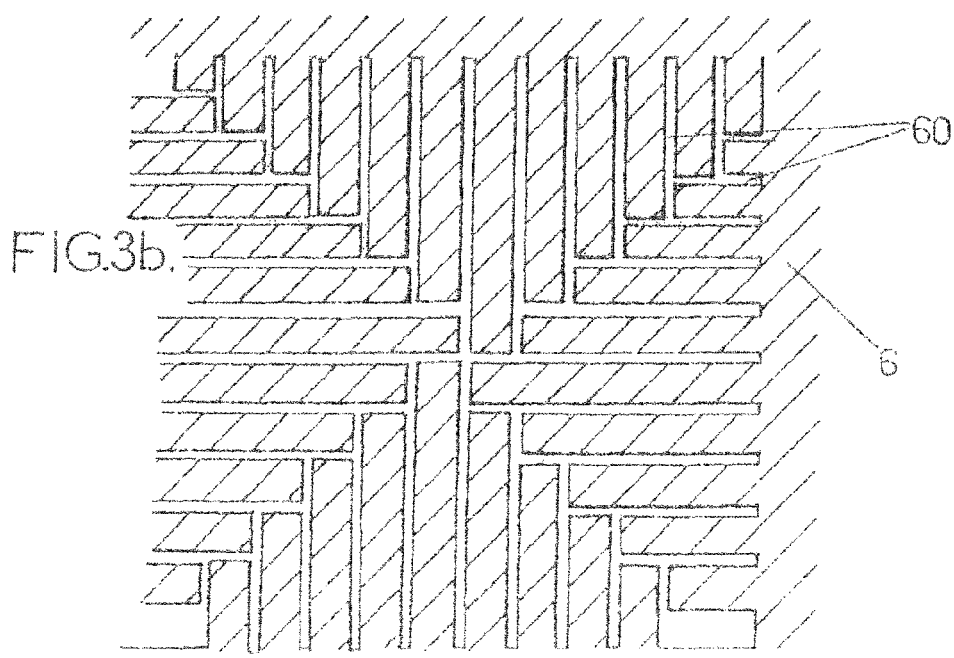

FIGS. 3*a* and 3*b* show two possible hole patterns for the electrode 6, but the Man skilled in the art will understand that many variations in the hole design may be implemented without modifying the operation of the plasma applicator. In these figures, the reference number 60 denotes the holes in the metal track portion which forms the electrode 6.

Figure 2B:
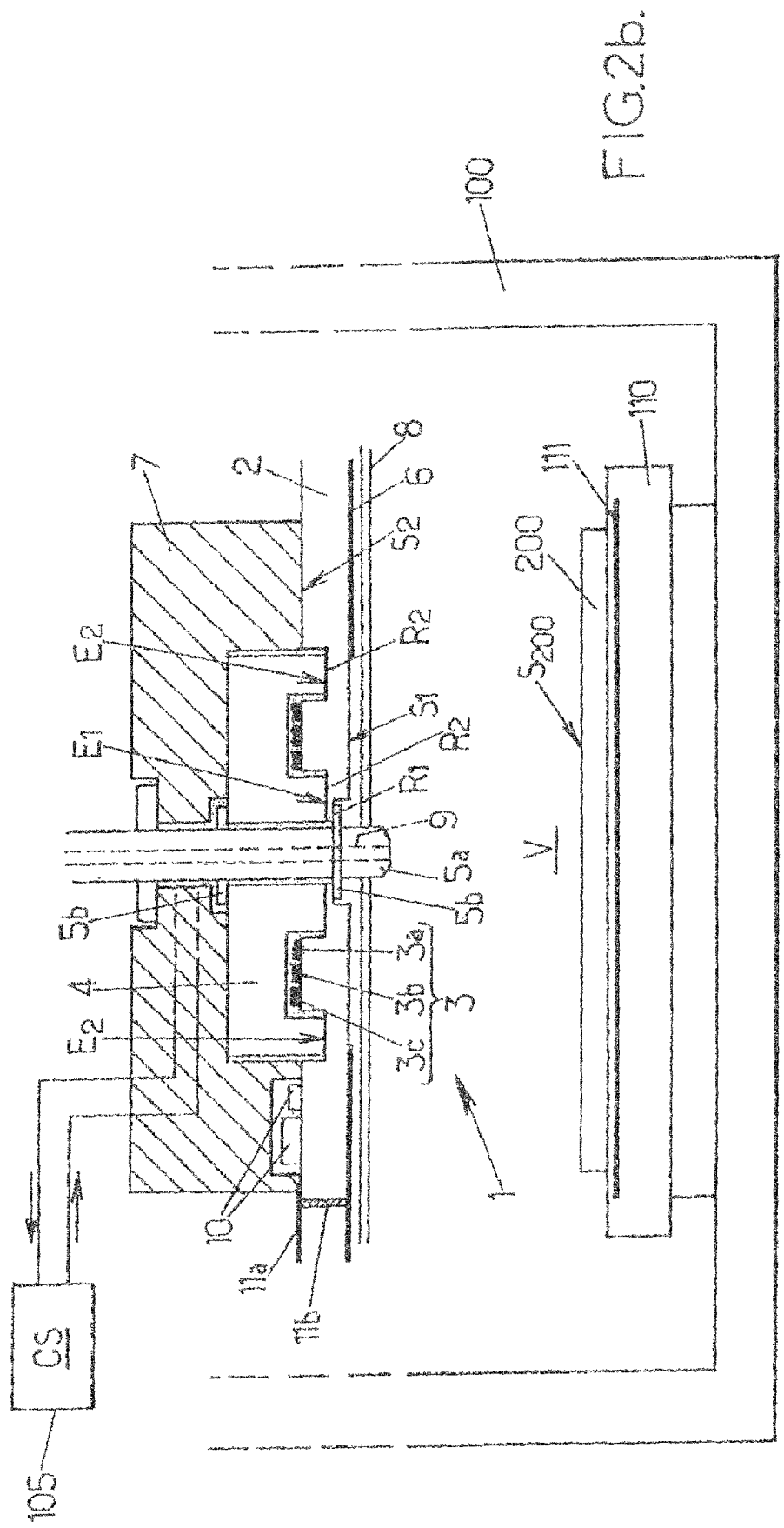

The plasma applicator 1 may optionally further include some of the following elements:

- a filling block 7, which is located opposite to the front surface $S_1$ of the support member 2, and shaped so as to conform with an outer surface of the ferromagnetic core 4 of the ferromagnetic inductively coupled plasma source, and further adapted to conduct heat away from the ferromagnetic core. In such case, the means for rigidly connecting the ferromagnetic core 4 to the support member 2 may be further adapted for transferring heat from the core to the filling block 7. Then, the filling block 7 may be connected to a cooling system 105, also noted CS, for drawing out heat produced in the plasma applicator 1 during operation. In this way, the temperature of the ferromagnetic core 4 can be maintained low enough during the operation of the plasma applicator 1, so that any damage to the ferromagnetic core 4 is prevented. For example, the shaft 5*a* may be out of copper (Cu) and designed so as to exhibit tight thermal contact with both the ferromagnetic core 4 and the filling block 7;
- a window 8 transparent to electric and magnetic fields, arranged parallel to the front surface $S_1$ of the support member 2 and closer to the inner volume of the vacuum vessel 100 than this front surface. Such window may be in silica or quartz ($SiO_2$) or alumina ($Al_2O_3$), for example, or any other material not altered by the plasma. It is intended to protect the support member 2 against the plasma;
- one or several gas feed inlets which are arranged across the support member 2 (FIGS. 1*d* and 2*b*), and adapted for discharging gas into the vacuum vessel 100. Optionally, the gas feed inlet(s) may also extend through the window 8 if this latter is present in the applicator. In FIG. 1*d*, a gas feed inlet 9 is located on a lateral side of each ferromagnetic inductively coupled plasma source. Also possibly, a gas feed inlet 9 may be arranged in the through-hole of the ferromagnetic core 4, with an extension of this gas feed inlet through the support member 2. FIG. 2*b* illustrates such configuration, where the gas feed inlet 9 is a gas conduct located within the shaft 5*a*;
- electrical components 10, which are borne by the support member 2 and may be power supply components, power distribution components, impedance matching components, operation control components, heating components, probe and metrology components, etc.; and
- polarizing means which are also arranged on the support member 2, and adapted for controlling a voltage between a terminal of the coil 3 and the electrode 6.

The Man skilled in the art will understand that these optional elements may be implemented in the vacuum vessel 100 apart from the plasma applicator 1. For example, FIG. 1*c* shows an embodiment of the invention in which a gas feed inlet 150 is separate from the plasma applicator 1, through one of the sidewalls 102 of the vacuum vessel 100. Then, the window 8 if any may be continuous over its whole extent.

According to preferred embodiments of the invention, the plasma applicator 1 is manufactured using an existing technology implemented for electrical circuits. In particular, the support member 2 and the metal track portions borne by this latter may form a printed circuit board (PCB) assembly, a thick film technology assembly, or a co-fired ceramic technology assembly. These technologies are well-known, so that they are not described again here. Using one of them takes benefit from the experience and all the improvements which are now available. In particular, the cost for the support member 2 with the coil 3 and the electrode 6, together with electrical connections and other components of the applicator 1, can be reduced in a large extent. Additionally, it is thus possible, especially for the printed circuit board technology, to arrange several ferromagnetic inductively coupled plasma sources with one and same common support member. The plasma sources may be then juxtaposed on the common support member close to one another, as this will be described later.

In particular, using such electrical circuit technology is suitable for the support member 2 to be comprised of several electrically insulating substrate units that are stacked on one another. Each substrate unit has an individual substantially flat plate shape, with at least one surface located intermediate between the front surface $S_1$ and the back surface $S_2$ of the whole support member 2. At least some of these intermediate surfaces, which are parallel to the surfaces $S_1$ and $S_2$, may be provided with metal track portions forming electrical connections and components. Such implementation of the support member 2 makes it possible for the coil 3 to be formed by several spiral metal track portions arranged on separate substrate unit surfaces, each one surrounding the magnetic flux bundle exiting the ferromagnetic core 4. When these spiral metal track portions are further electrically connected in series with conducting vias crossing the intermediate substrate units, a magnetic field with even higher strength may be produced in the plasma volume V. All the substrate units forming the support member 2 may be glued together on the intermediate surfaces.

Using a multi-substrate support member 2 is also especially suitable for obtaining easily the recesses $R_1$ and $R_2$ introduced before. Indeed, these recesses may be produced by cutting off corresponding portions of the substrate units located near the front surface $S_1$ and/or back surface $S_2$ of the plasma applicator 1, after the substrate units are joined together.

Figure 4A:
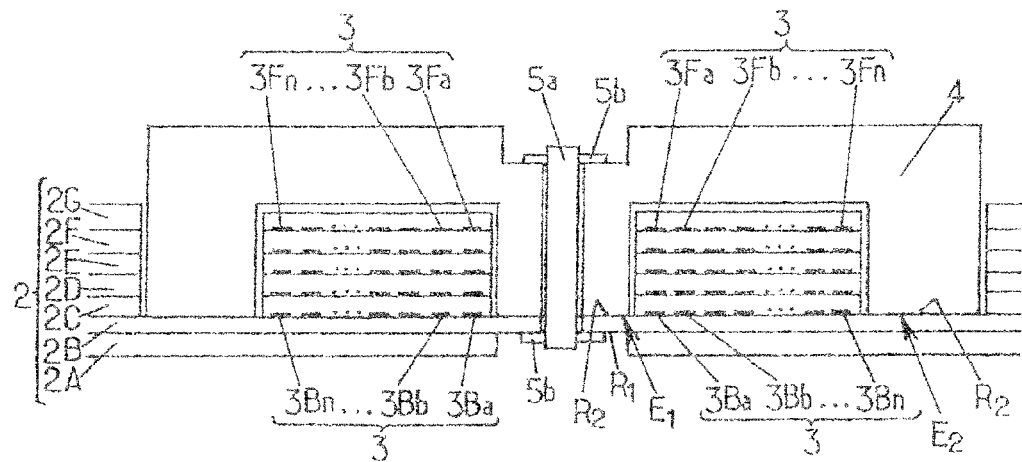
FIG. 4a is an enlarged cross-sectional view of a ferromagnetic inductively coupled plasma source used in one embodiment of the invention.

FIG. 4*a* shows a ferromagnetic inductively coupled plasma source designed using such multi-substrate support member. For example, the support member 2 may comprise seven substrate units labelled 2A to 2G. The recess $R_1$ for the lower blocking element 5*b* is provided by forming a hole in the substrate unit 2A which is larger than the corresponding hole in the substrate unit 2B, this latter being sized in accordance with the diameter of the shaft 5*a*. The recesses $R_2$ are provided by forming identical holes in the substrate units 2C to 2G, corresponding to the respective cross-sectional shapes of the end faces $E_1$ and $E_2$ of the ferromagnetic core 4. The multi-substrate structure of the support member 2 further provides a planar intermediate surface for each pair of adjacent substrate units, which is located between and parallel to the surfaces $S_1$ and $S_2$. Then, one or several spiral coil turns may be provided on each of these intermediate surfaces. For example, the coil turns 3Ba, 3Bb, . . . , 3Bn are provided on the surface intermediate between the substrate units 2B and 2C. They may be produced on the upper surface of the substrate unit 2B and then embedded in a glue layer which joins the substrate units 2B and 2C together. Similar coil turns may also be provided on the upper surfaces of the substrate units 2C to 2F, e.g. the coil turns labelled 3Fa, 3Fb, . . . , 3Fn on the upper surface of the substrate unit 2F, with vias (not shown) across the substrate units for electrically connecting in series the coil turns comprised in all the intermediate surfaces. In addition, the coil turns and the connecting vias are designed so that an electrical current flowing in all the coil turns circulates about the end face $E_1$ with one rotational direction. Therefore, the coil 3 is cylindrical with one or more turns in several of the surfaces of the support member 2. Preferably, the coil turns in the surfaces of the support member 2 may be arranged with a maximum density in the volume portion comprised between the end faces $E_1$, $E_2$ and the bridging portion of the core 4.

Figure 4B:
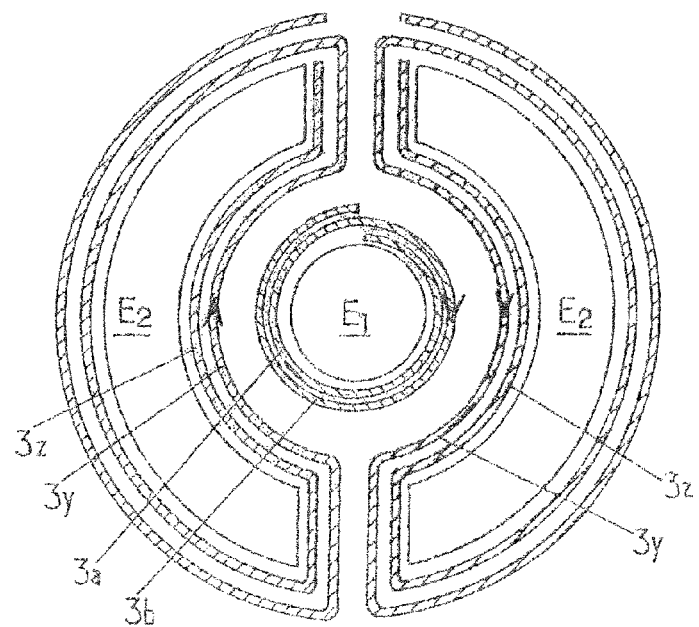
FIG. 4b is an in-plane enlarged view of another ferromagnetic inductively coupled plasma source used in one embodiment of the invention.

FIG. 4b shows another design for the ferromagnetic inductively coupled plasma source, which is suitable when one of the end faces of the ferromagnetic core is two-part. For example in this figure which corresponds to one surface of the support member 2, the end face $E_2$ is divided into two separate parts which are located respectively on left and right sides of the center end face $E_1$. Then, the coil 3 may comprise in this surface of the support member 2 one or several turns 3a, 3b which are arranged around the end face $E_1$, but it may further comprise one or several additional turns 3y, 3z which are arranged separately around one or each one of the separate parts of the end face $E_2$. Then, all coil turns must be connected electrically so that a first electrical current which flows in the turns around the end face $E_1$ circulates with a rotational direction opposite to that of second electrical currents flowing in the turns around the separate parts of the end face $E_2$ (see the arrows in FIG. 4b). The Man skilled in the art will understand that the respective features of the designs of FIGS. 4a and 4b may be combined all with one another.

Each substrate unit is produced according to the electrical circuit technology used. For example, it may be formed of woven glass fibers or mate fibers embedded in a resin matrix for the printed circuit board technology. With other technologies used alternatively, the substrate units may be glass plates, ceramic plates or metal plates covered with at least one electrically insulating layer. For every one of the above-listed technologies, the coil 3 and the electrode 6 are metal track portions that are formed on some of the substrate unit surfaces using processing steps of this technology.

Using such electrical circuit technology is also particularly suitable for producing electrically conducting vias for connecting metal track portions which are arranged on separate surfaces of the support member 2. For illustrative purpose, references 11a and 11b in FIGS. 2a-2b denote such metal track portion and via. It is particularly suitable too for adding the additional electrical components 10 into the plasma applicator 1. Indeed, such components 10 can be thus secured easily on the support member 2, and connected electrically to other elements of the plasma applicator 1.

The vacuum vessel 100 equipped with a plasma applicator 1 as just described forms a surface treatment device, provided that an electric power supply is connected for supplying current to the coil 3 of the ferromagnetic inductively coupled plasma source. Thus, the electrical current supplied by the power supply produces the magnetic field which extends in the ferromagnetic core 4 and in the plasma volume V.

Figure 5A:
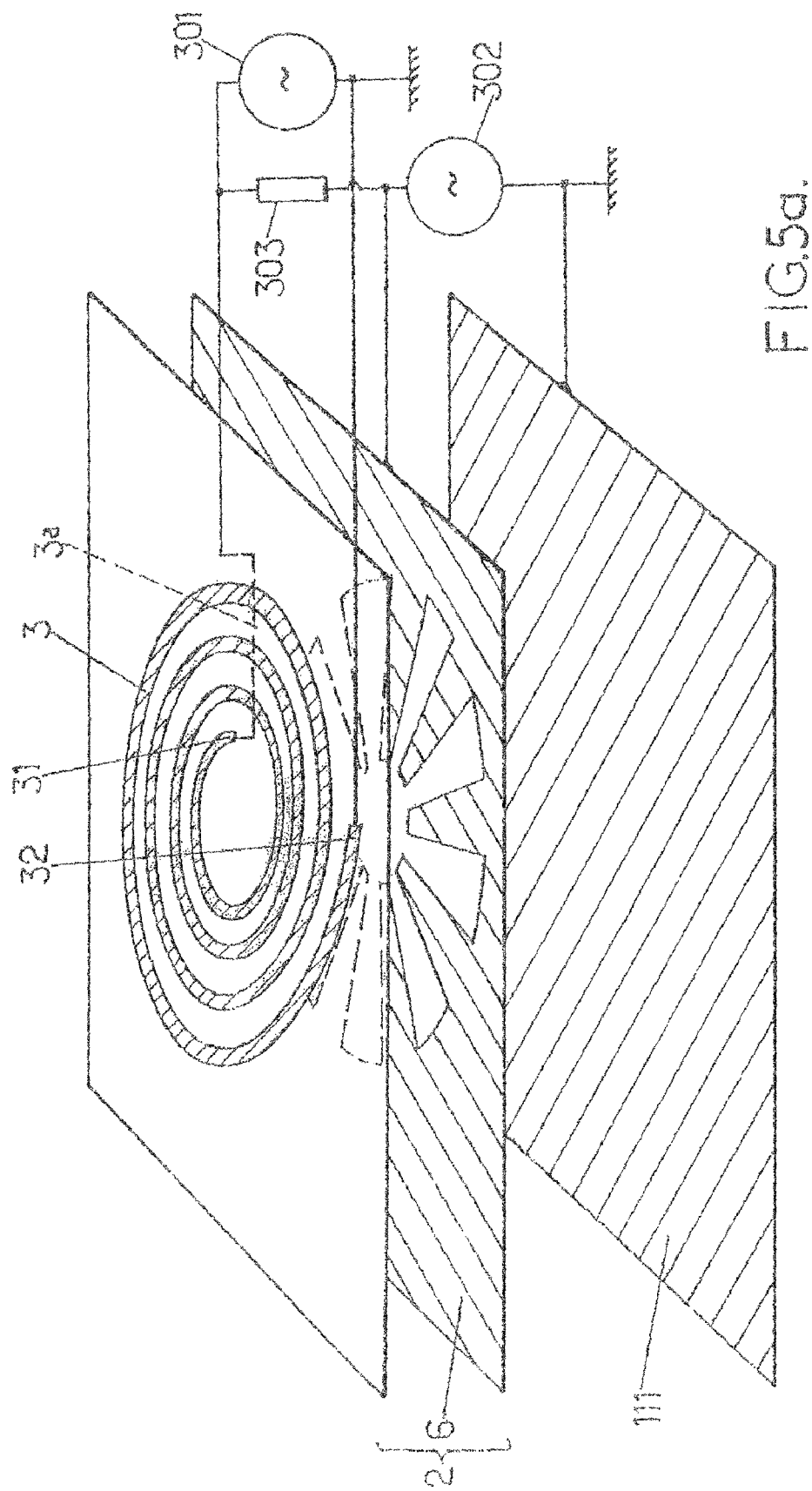
FIGS. 5a and 5b illustrate two electrical connecting modes for a plasma applicator according to the invention.

FIG. 5a shows only the main electrical components of such surface treatment device. The two end terminals 31 and 32 of the coil 3 are connected respectively to two output terminals of a first electric power supply unit 301. To this purpose, the support member 2 may comprise a further metal track segment 3a which extends from the center terminal 31 of the coil 3 to a side edge of the support member. This metal track segment 3a may be located on any surface of the support member 2 other than those provided with the coil 3 or the electrode 6. Alternatively, one terminal 31 of the coil 3 may be connected using a strap external to the support member 2. The power supply unit 301 is of AC type, possibly operating in a frequency range of 50 kHz (kilohertz) to 30 MHz (megahertz). Preferably, the power supply 301 operates at low RF frequency, for example at about 400 kHz.

A second electric power supply unit 302 may be used for producing a voltage between the electrode 6 of the plasma applicator 1 and the electrode 111 which is external to the plasma applicator 1. Both power supply units 301 and 302 may operate at one and same frequency. Alternatively, the power supply unit 301 may be of AC type again, and the power supply unit 302 may be of DC type. The power supply units 301 and 302 will be selected so that the ferromagnetic inductively coupled plasma source 1 and the electrode 6 cooperate efficiently for providing the plasma with sufficient energy in the volume V. Optionally, electrically coupling means 303 may be arranged for connecting the electrode 6 to one of the terminals 31 and 32 of the coil 3. The coupling means 303 may be active or passive, and are selected so as to further adjust the plasma parameters.

Figure 5B:
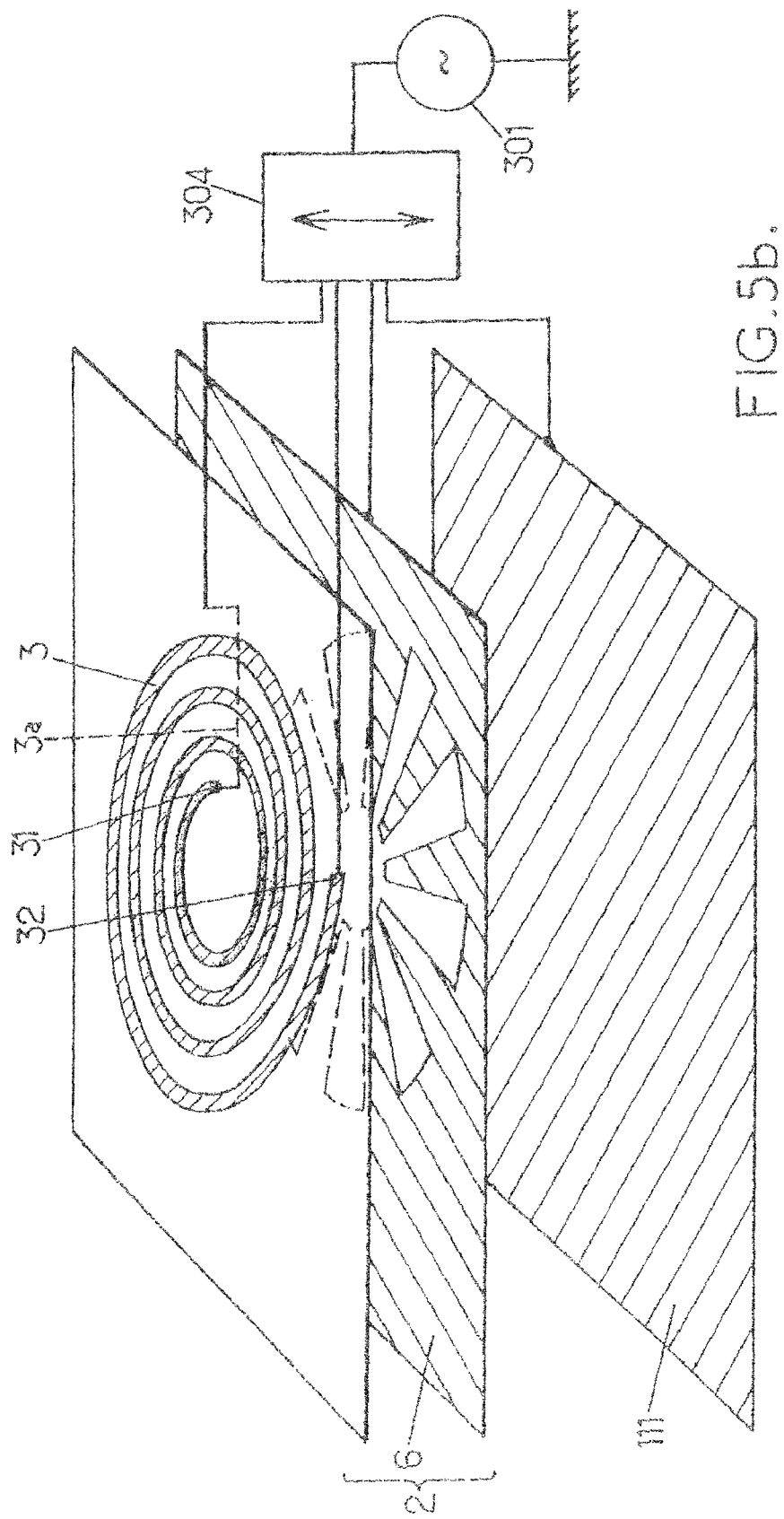

An alternative connecting mode shown in FIG. 5b is limited to using only one electrical power supply unit. To this purpose, a power divider 304 may be used for distributing the electrical current supplied by the power supply unit 301 between the coil 3 and the capacitor formed by the electrodes 6 and 111, and/or for adapting a phase shift of the current supplied to the electrodes 6 and 111 with respect to that supplied to the coil 3.

In a preferred embodiment of the invention, the inductive plasma applicator 1 may comprise several ferromagnetic inductively coupled plasma sources, which are juxtaposed to one another parallel to the surfaces of support member 2. Such multi-source plasma applicator has already been shown in FIGS. 1a-1d. The support member 2 is common to all the ferromagnetic inductively coupled plasma sources and all the ferromagnetic cores 4 are affixed to it. Preferably all coils 3 are located on a same surface of the common support member 2, so that they can be produced in one same manufacturing step sequence.

Figure 6A:
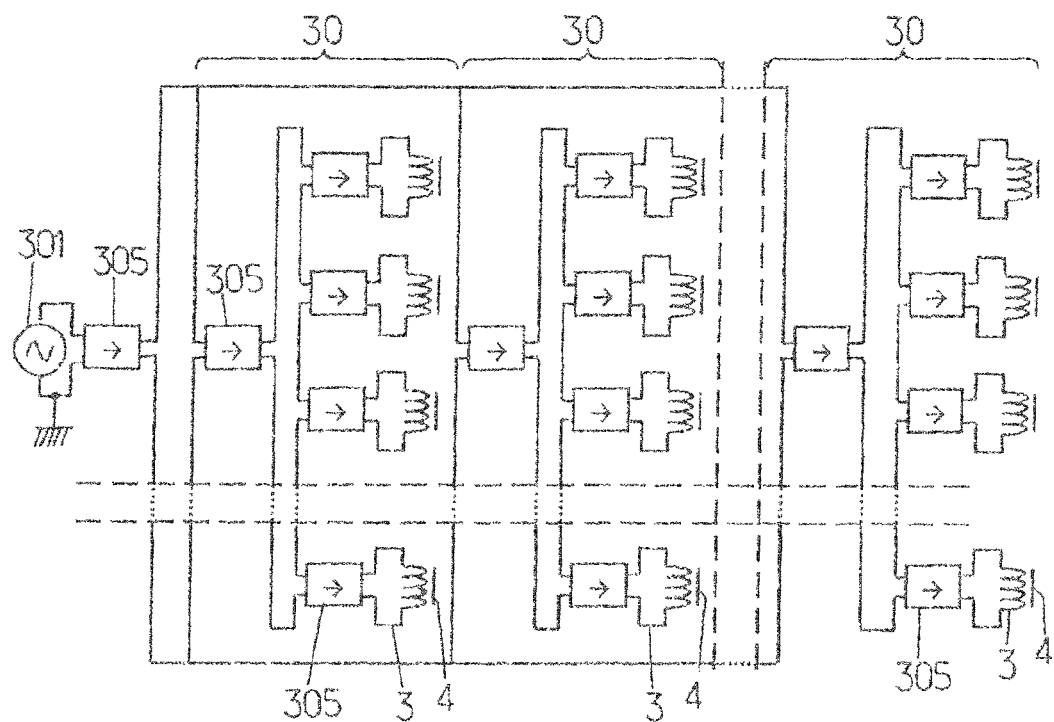
FIGS. 6a and 6b illustrate connecting modes for a multi-source inductive plasma applicator according to the invention.

The respective coils 3 of at least two of the ferromagnetic inductively coupled plasma sources may be connected electrically in series or in parallel or in a mixed series-parallel connecting mode. FIG. 6a is an electrical diagram for such connecting mode, using power adaptors 305. Then, the plasma applicator 1 may further comprise first metal track segments for electrically connecting in series the respective coils of at least two ferromagnetic inductively coupled plasma sources. In a more general way, all the coils 3 may be distributed in separate groups, also called clusters and referenced 30 in FIG. 6a, so that coils pertaining to a same cluster are power-supplied in the series connecting mode. In addition, different coil clusters may be supplied with separate currents by the power supply unit 301 in a parallel connecting mode. All the currents supplied to different clusters and different coils 3 may be adapted by using appropriately the power adaptors 305. Such components may be external to the plasma applicator 1, but they are preferably added onto the common support member 2 by implementing the improvements available for the manufacturing technology of the support member 2 and the metal portions.

The multi-source plasma applicator 1 may further comprise second metal track segments for electrically connecting to one another several electrodes 6 with hole patterns which are centred respectively with the coils 3 of at least two different ferromagnetic inductively coupled plasma sources. In this way, the electrodes 6 which are so connected have a same electrical voltage with respect to the electrode 111. Possibly, the electrodes 6 of all the ferromagnetic inductively coupled plasma sources may be distributed in groups, with the electrodes pertaining to a same group being connected to one another, and electrodes pertaining to different groups being supplied with different voltage values. Such electrode distribution makes it possible to modulate the polarization voltage of each electrode group, so as to compensate for applicator edge effects, for example. It is possible in this way to obtain a large, possibly more than 1 m² (square meter), and even very large, possibly more than 5 m², plasma area with good surface processing uniformity.

Figure 6B:
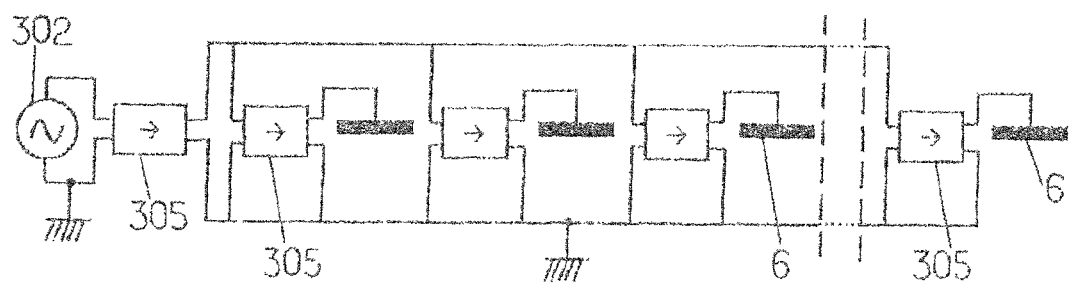

All the respective electrodes associated to the multiple ferromagnetic inductively coupled plasma sources are preferably located on one and same surface of the common support member 2. Electrodes 6 with hole patterns that are centred respectively with the coils 3 of at least two different ferromagnetic inductively coupled plasma sources may comprise one common metal track portion. Then the multi-source plasma applicator is actually provided with one large area electrode 6, or few large area electrodes 6, which each has/have hole patterns centred with the coils 3 located just above. Alternatively, electrodes 6 with hole patterns centred respectively with the coils of at least two different ferromagnetic inductively coupled plasma sources may be connected in parallel, as shown in the electrical diagram of FIG. 6*b*. Then, adaptors 305 may be associated with each electrode 6, so as to adjust the electrical voltage supplied to this electrode.

For the multi-source plasma applicator, the ferromagnetic inductively coupled plasma sources 1 may be juxtaposed so as to form a plasma source array parallel to the vacuum vessel wall 101. In particular, such array may have a two-dimensional pitch which is comprised between 1×1 cm² and 15×15 cm². The reader will then understand that the invention is particularly suitable for providing low-cost large-area plasma source, with a modular design suitable for being adapted to many vessel designs and applications. With such design, the processing uniformity achieved with the plasma applicator is related to the individual sizes of the plasma sources. Using for manufacturing the plasma applicator a technology which has been developed for electrical circuits with planar substrates, is particularly adapted for multi-source applicator with a great number of sources. But the fabrication tools which are thus used for producing the substrate units may limit the possible size of these substrate units. Because of such limitation, the support member may be segmented, in particular for large area surface treatment devices, with separate portions which are arranged next to one another parallel to a common plane, so as to form all together the large area multi-source plasma applicator.

Figure 7A:
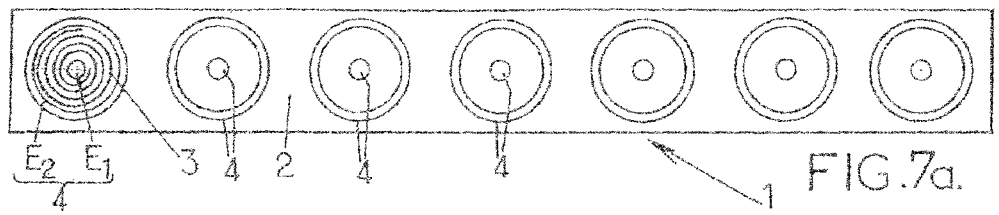
FIGS. 7a-7c illustrate possible arrays for multi-source inductive plasma applicators according to the invention.
Figure 7B:
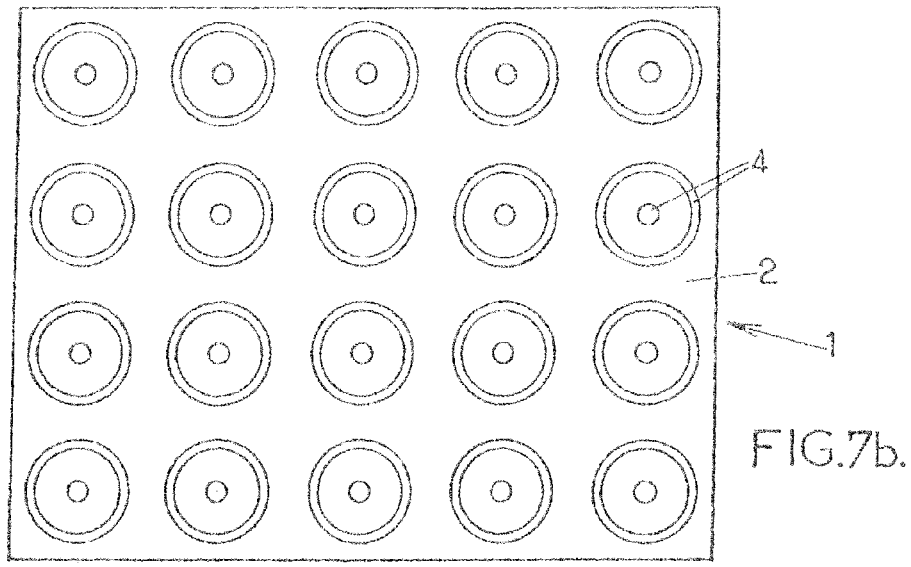
Figure 7C:
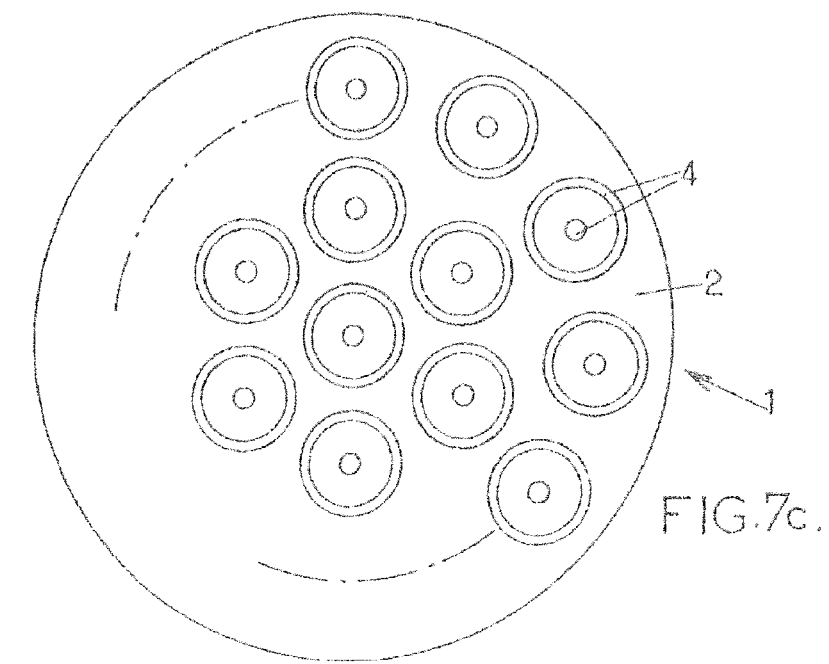
Figure 8A:
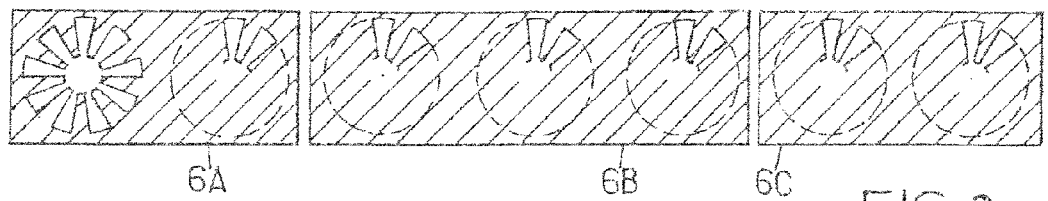
FIGS. 8a-8c represent possible electrode designs for the multi-source inductive plasma applicators of FIGS. 7a-7c, respectively.
Figure 8B:
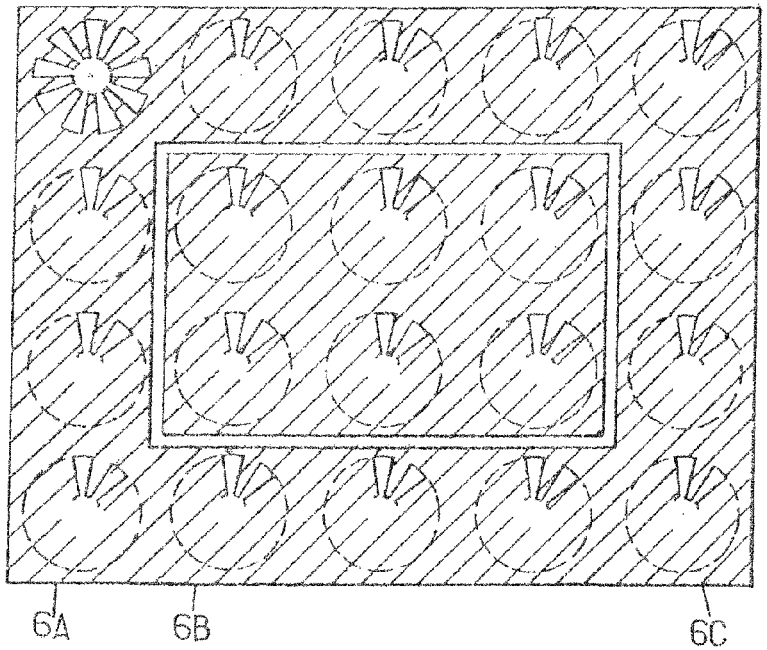
Figure 8C:
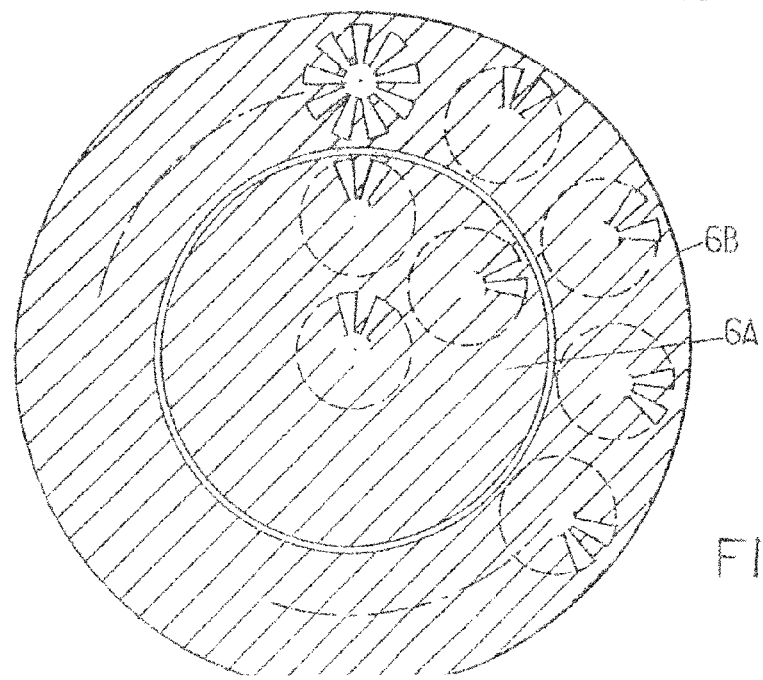

FIGS. 7*a*-7*c* show three possible distributions of the individual plasma sources in the plane of the common support member 2. These figures are planar views of the surface of the support member 2 which bears all the coils 3 and the ferromagnetic cores 4. The source arrangement may be linear (FIG. 7*a*), square (FIG. 7*b*), honey comb like (FIG. 7*c*), etc. FIGS. 8*a*, 8*b* and 8*c* are planar views of the surface of the common support member 2 which bears the electrodes 6. They show possible groupings of the electrodes 6, respectively for the arrays of FIGS. 7*a*, 7*b* and 7*c*. References 6A, 6B, 6C denote different electrode groups. Then, each electrode group 6A, 6B, 6C is to replace the individual electrodes 6 in the electrical diagram of FIG. 6*b*.

Using gas feed inlets 9 which are arranged through the support member 2 is particularly suitable for a multi-source plasma applicator. The multiple gas feed inlets may be arranged so as to discharge gas at locations spaced apart from one another in the front face $S_1$ of the plasma applicator 1. Then, an appropriate balance in the gas volumes which are discharged respectively by the gas feed inlets should be obtained. Any appropriate means for regulating the gas volume discharged by any one of the gas feed inlets may be used. FIG. 1*d* illustrates one embodiment of a multi-source plasma applicator, in which the vacuum vessel 100 includes a gas expansion volume Z which is located behind the plasma applicator 1, and provided with a primary gas feed inlet 150. Such expansion volume Z ensures that similar volumes are discharged into the plasma volume V by all the gas feed inlets 9. Possibly, the gas feed inlets 9 may be adjusted individually, for improving the processing uniformity of the substrate.

It should be understood that many variations may be introduced in the plasma applicator embodiments which have been described. Such variations may relate to sizing or designing features, while maintaining at least some of the advantages of the invention. They may also relate to the electrical connecting mode between the plasma applicator and the electrical power supply unit(s).

The invention claimed is:

1. An inductive plasma applicator comprising:
   a support member with a generally flat plate shape, adapted for forming part of or being arranged on a vacuum vessel wall, said support member having a front surface intended to be oriented towards an inner volume of the vacuum vessel, a back surface and possibly additional surfaces intermediate between the front and back surfaces, said surfaces being parallel to each other;
   at least one ferromagnetic inductively coupled plasma source including:
      at least one electrically conducting coil comprising one turn or several turns with a planar spiral design arranged on a surface of the support member;
      an open-loop ferromagnetic core having at least two end faces oriented towards one and same magnetic output side; and
      means for rigidly connecting the ferromagnetic core onto the support member opposite to the front surface of said support member, with the magnetic output side of the ferromagnetic core oriented towards the inner volume of the vacuum vessel, and the coil turn or turns surrounding a magnetic flux bundle exiting through at least one of the end faces of the ferromagnetic core; and
   at least one electrode having a hole pattern centred with respect to the coil and adapted not to inhibit the magnetic flux bundle from extending in the inner volume of the vacuum vessel, said electrode being further adapted for forming a capacitor with another electrode external to the applicator;
wherein the coil of the ferromagnetic inductively coupled plasma source and the electrode comprise respective metal track portions distributed on the surfaces of the support member, with the metal track portions of the electrode being located closer to the inner volume of the vacuum vessel than the metal track portions of the coil.

2. The inductive plasma applicator of claim 1, wherein the support member comprises an assembly of several substrate units stacked on one another, with surfaces of each substrate unit forming the surfaces of the support member.

3. The inductive plasma applicator of claim 2, wherein the coil is cylindrical with one or more turns in several of the surfaces of the support member.

4. The inductive plasma applicator of claim 1, wherein the support member and the metal track portions form an assembly selected in a list comprising a printed circuit board assembly, a thick film technology assembly, and a co-fired ceramic technology assembly.

5. The inductive plasma applicator of claim 1, wherein the support member comprises recesses such that the end faces of the ferromagnetic core are closer to the inner volume of the vacuum vessel than the metal track portions of the coil.

6. The inductive plasma applicator of claim 1, wherein a ratio between a thickness and a longest diameter of said ferromagnetic core is higher than 0.2, preferably higher that 0.3, said thickness and diameter being measured respectively perpendicular and parallel to the surfaces of the support member.

7. The inductive plasma applicator of claim 1, wherein at least one metal track portion of the coil is more than 30 μm thick, preferably more than 100 μm thick, perpendicular to the surfaces of the support member.

8. The inductive plasma applicator of claim 1, further comprising electrical components borne by the support member and selected in a list comprising power supply components, power distribution components, impedance matching components, operation control components, heating components, probe and metrology components.

9. The inductive plasma applicator of claim 1, comprising several ferromagnetic inductively coupled plasma sources juxtaposed to one another parallel to the surfaces of support member.

10. The inductive plasma applicator of claim 9, wherein the respective coils of at least two of the ferromagnetic inductively coupled plasma sources are connected electrically in series or in parallel or in a mixed series-parallel connecting mode.

11. The inductive plasma applicator of claim 10, further comprising first metal track segments for electrically connecting in series the respective coils of at least two ferromagnetic inductively coupled plasma sources.

12. The inductive plasma applicator of claim 9, further comprising second metal track segments for electrically connecting to one another electrodes with hole patterns centred respectively with the coils of at least two different ferromagnetic inductively coupled plasma sources.

13. The inductive plasma applicator of claim 9, wherein electrodes with hole patterns centred respectively with the coils of at least two different ferromagnetic inductively coupled plasma sources comprise one common metal track portion.

14. The inductive plasma applicator of claim 9, wherein electrodes with hole patterns centred respectively with the coils of at least two different ferromagnetic inductively coupled plasma sources are connected in parallel.

15. The inductive plasma applicator of claim 9, wherein the ferromagnetic inductively coupled plasma sources are juxtaposed so as to form a plasma source array parallel to the vacuum vessel wall.

16. The inductive plasma applicator of claim 15, wherein the array has a two-dimensional pitch comprised between $1 \times 1$ cm$^2$ and $15 \times 15$ cm$^2$.

17. The inductive plasma applicator of claim 1, wherein a maximum thickness of the applicator between a back surface of each ferromagnetic core opposite to the front surface of the support member and said front surface is less than 6 cm.

18. The inductive plasma applicator of claim 1, further comprising a filling block located opposite to the front surface of the support member, and shaped so as to conform with an outer surface of the ferromagnetic core of each ferromagnetic inductively coupled plasma source, and further adapted to conduct heat away from said ferromagnetic core.

19. The inductive plasma applicator of claim 18, wherein the means for rigidly connecting the ferromagnetic core of each ferromagnetic inductively coupled plasma source to the support member are further adapted for transferring heat from said ferromagnetic core to the filling block.

20. The inductive plasma applicator of claim 1, further comprising at least one gas feed inlet arranged across the support member, and adapted for discharging gas into the vacuum vessel.

21. The inductive plasma applicator of claim 20, wherein the gas feed inlet is arranged in a through-hole of the ferromagnetic core, with an extension of said gas feed inlet through the support member.

22. The inductive plasma applicator of claim 1, further comprising a window transparent to electric and magnetic fields, arranged parallel to the front surface of the support member and closer to the inner volume of the vacuum vessel than said front surface.

23. The inductive plasma applicator of claim 1, further comprising polarizing means arranged on the support member, and adapted for controlling a voltage between a terminal of the coil and the electrode.

24. The inductive plasma applicator of claim 1, wherein the hole pattern of the electrode is designed similar to a Faraday shield, so that variations in the electric field produced by said electrode in front of the ferromagnetic inductively coupled plasma source are smoothened parallel to said electrode.

25. A vacuum vessel comprising the inductive plasma applicator of claim 1.

26. A surface treatment device comprising the vacuum vessel of claim 25, and further comprising an electric power supply unit connected so as to supply current to the coil of each ferromagnetic inductively coupled plasma source.

27. The surface treatment device of claim 26, further comprising electrically coupling means arranged so as to connect the electrode and a terminal of the coil of at least one ferromagnetic inductively coupled plasma source, with a parallel connecting mode with respect to a current output terminal of the electric power supply unit.

* * * * *